(12) United States Patent
Miyawaki et al.

(10) Patent No.: US 10,002,841 B2
(45) Date of Patent: Jun. 19, 2018

(54) SEMICONDUCTOR DEVICE (71) Applicant: DENSO CORPORATION, Kariya, Aichi-pref. (JP)

(72) Inventors: Shotaro Miyawaki, Kariya (JP); Naohiko Hirano, Kariya (JP); Akiyoshi Asai, Kariya (JP); Yasutomi Asai, Kariya (JP)

(73) Assignee: DENSO CORPORATION, Kariya (JP)

( * ) Notice: Subject to any disclaimer, the term of this patent is extended or adjusted under 35 U.S.C. 154(b) by 6 days.

(21) Appl. No.: 15/505,273

(22) PCT Filed: Jul. 31, 2015

(86) PCT No.: PCT/JP2015/003860
§ 371 (c)(1),
(2) Date: Feb. 21, 2017

(87) PCT Pub. No.: WO2016/035251
PCT Pub. Date: Mar. 10, 2016

(65) Prior Publication Data
US 2017/0256510 A1 Sep. 7, 2017

(30) Foreign Application Priority Data

Sep. 1, 2014 (JP) .................................. 2014-177044

(51) Int. Cl.
*H01L 23/00* (2006.01)
(52) U.S. Cl.
CPC .............. *H01L 24/09* (2013.01); *H01L 24/16* (2013.01); *H01L 24/49* (2013.01); *H01L 2224/05554* (2013.01); *H01L 2224/05624* (2013.01); *H01L 2224/0912* (2013.01); *H01L 2224/16104* (2013.01); *H01L 2224/45139* (2013.01); *H01L 2224/45144* (2013.01); *H01L 2224/45147* (2013.01); *H01L 2224/48091* (2013.01); *H01L 2224/48247* (2013.01); *H01L 2224/48453* (2013.01); *H01L 2224/48465* (2013.01); *H01L 2224/48471* (2013.01); *H01L 2224/48479* (2013.01); *H01L 2224/4912* (2013.01); *H01L 2224/49171* (2013.01); *H01L 2224/73265* (2013.01); *H01L 2924/00011* (2013.01); *H01L 2924/00014* (2013.01); *H01L 2924/01013* (2013.01); *H01L 2924/01029* (2013.01);

(Continued)

(58) Field of Classification Search
CPC ....................................................... H01L 24/09
See application file for complete search history.

(56) References Cited

U.S. PATENT DOCUMENTS

| 2009/0014848 A1* | 1/2009 | Ong Wai Lian .... H01L 23/4952 257/666 |
| 2009/0236742 A1* | 9/2009 | Low ........................ H01L 24/05 257/737 |

(Continued)

*Primary Examiner* — William Harriston
(74) *Attorney, Agent, or Firm* — Posz Law Group, PLC (57) ABSTRACT

Electrode pads disposed on a first surface of a semiconductor element include a first pad located close to a corner and a second pad located apart from the corner compared with the first pad. A first wire connected to the first pad has a smaller Young's modulus than a second wire connected to the second pad. A thickness of an intermetallic compound layer formed by the first wire and the first pad is larger than a thickness of an intermetallic compound layer formed by the second wire and the second pad.

5 Claims, 4 Drawing Sheets

(52) U.S. Cl.
CPC ............ *H01L 2924/0132* (2013.01); *H01L 2924/01079* (2013.01); *H01L 2924/10253* (2013.01); *H01L 2924/181* (2013.01)

(56) References Cited

U.S. PATENT DOCUMENTS

| | | | |
|---|---|---|---|
| 2011/0304046 A1 | 12/2011 | Kitazawa et al. | |
| 2015/0028465 A1* | 1/2015 | Itoh | H01L 24/05 |
| | | | 257/676 |
| 2015/0137391 A1* | 5/2015 | Bez | H01L 21/56 |
| | | | 257/784 |

* cited by examiner

SEMICONDUCTOR DEVICE

CROSS REFERENCE TO RELATED APPLICATIONS

This application is a U.S. national stage application of International Patent Application No. PCT/JP2015/003860 filed on Jul. 31, 2015 and is based on Japanese Patent Application No. 2014-177044 filed on Sep. 1, 2014, the disclosure of which is incorporated herein by reference.

TECHNICAL FIELD

The present disclosure relates to a semiconductor device including a semiconductor element and a connection member. Herein, the semiconductor element has multiple electrode pads, and respective electrode pads are connected to the connection member via bonding wires.

BACKGROUND

Generally, a semiconductor device proposed as a semiconductor device of a type described above includes a semiconductor element shaped to a rectangular plate, multiple electrode pads made of same metal and provided to one surface of the semiconductor element, and a connection member provided outside the semiconductor element. The respective electrode pads are connected to the connection member via bonding wires made of Au (gold).

In order to reduce material cost of the bonding wires, a semiconductor device using bonding wires made of Cu (copper) instead of bonding wires made of Au has been proposed recently (see Patent Literature 1).

PATENT LITERATURE

[Patent Literature 1] JP 2010-199491 A

SUMMARY

In view of the foregoing circumstances, it is an object of the present disclosure to provide a semiconductor device capable of improving temperature cycle resistance of electrode pads and reducing material cost of bonding wires at the same time.

According to a first aspect of the present disclosure, a semiconductor device includes a rectangular plate shaped semiconductor element having a first surface disposed on a front side and a second surface disposed on a back side, a plurality of electrode pads made of same metal and disposed on the first surface of the semiconductor element, and a connection member disposed outside of the semiconductor element. The plurality of electrode pads are individually connected to the connection member via respective bonding wires made of metal. An intermetallic compound layer is disposed between each of the plurality of electrode pads and the corresponding bonding wire, and the intermetallic compound layer is made of an intermetallic compound including both of the metal configuring the plurality of electrode pads and the metal configuring the bonding wires.

The plurality of electrode pads disposed on the first surface of the semiconductor element include a first pad and a second pad, the first pad is located close to a corner of the semiconductor element, and the second pad is located apart from the corner of the semiconductor element compared with the first pad.

The bonding wires include a first wire connected to the first pad and a second wire connected to the second pad, and a Young's modulus of the first wire is smaller than a Young's modulus of the second wire.

A thickness of the intermetallic compound layer formed by the first wire and the first pad is larger than a thickness of the intermetallic compound layer formed by the second wire and the second pad.

According to the semiconductor device configured as above, the first wire which is relatively soft is connected to the first pad, which is disposed close to the corner of the semiconductor element and is susceptible to cracking. Hence, it is easy to reduce stress applied from the wire to the pad. In addition, the thickness of the intermetallic compound layer disposed between the wire and the pad is relatively thick for the first pad. It thus becomes easy to increase mechanical strength of the first pad in wire bonding portion. Owing to advantages as above, an occurrence of cracking in the first pad due to temperature cycles can be readily restricted.

Further, by changing materials of the bonding wires for the first pad and the second pad, it becomes no longer necessary to make all of the bonding wires using expensive and soft metal. It thus becomes easy to reduce material cost. Consequently, according to the semiconductor device configured as above, a configuration capable of improving temperature cycle resistance of the electrode pads and reducing the material cost of the bonding wires at the same time can be realized.

According to another aspect of the present disclosure, a semiconductor device includes a rectangular plate shaped semiconductor element having a first surface disposed on a front side and a second surface disposed on a back side, a plurality of electrode pads made of same metal and disposed on the first surface of the semiconductor element, and a connection member disposed outside of the semiconductor element. The plurality of electrode pads are individually connected to the connection member via respective bonding wires made of same metal.

The plurality of electrode pads disposed on the first surface of the semiconductor element include a first pad and a second pad, the first pad is located close to a corner of the semiconductor element, and the second pad is located apart from the corner of the semiconductor element compared with the first pad.

A bump is bonded on the first pad, and the bump is made of metal having a smaller Young's modulus than the bonding wire corresponding to the first pad. A first intermetallic compound layer is disposed between the first pad and the bump, and the first intermetallic compound layer is made of an intermetallic compound including both of the metal configuring the first pad and the metal configuring the bump. The bonding wire connecting the first pad with the connection member is bonded on the first pad via the bump.

A second intermetallic compound layer is disposed between the second pad and the bonding wire connected to the second pad, and the second intermetallic compound layer is made of an intermetallic compound including both of the metal configuring the second pad and the metal configuring the bonding wire, and a thickness of the first intermetallic compound layer is larger than a thickness of the second intermetallic compound layer.

According to the semiconductor device configured as above, because the first pad is connected to the bonding wire via the bump which is softer than the bonding wire, stress applied from the bonding wire to the first pad can be eased. In addition, the first intermetallic compound formed by the first pad and the bump is thick. Thus, it becomes easy to increase mechanical strength of the first pad in wire bonding portion.

In the above configuration, because a need to use soft and expensive metal, such as Au, for the bonding wires is eliminated, it becomes easy to reduce material cost. Consequently, according to the semiconductor device configured as above, a configuration capable of improving temperature cycle resistance of the electrodes pads and to reduce the material cost of the bonding wires at the same time can be realized.

BRIEF DESCRIPTION OF DRAWINGS

The above and other objects, features and advantages of the present invention will become more apparent from the following detailed description made with reference to the accompanying drawings. In the drawings.

DETAILED DESCRIPTION

Hereinafter, embodiments of the present disclosure will be described with reference to the drawings. In respective embodiments below, same or equivalent portions are labeled with same reference symbol in the drawings for ease of description.

When bonding wires made of Au are replaced by bonding wires made of Cu in a semiconductor device, material costs of the wires can be reduced. Such replacement, however, raises a problem that temperature cycle resistance is reduced. More specifically, temperature cycles induce stress in electrode pads and the stress may cause cracking in the electrode pads. Cracking in the electrode pads may cause deterioration of electrical functions of the device.

The following will describe reasons of cracking occurrence in two aspects. Firstly, because Cu is physically harder than Au, bonding wires made of Cu become harder. Thus, stress applied from the wires to the electrode pads, which functions as a base, is increased.

Secondly, an intermetallic compound layer is formed between wires and pads in wire bonding portions due to interdiffusion which takes place between metal in the bonding wires and metal in the electrode pads, and the intermetallic compound layer formed when Cu wires are used is thinner than the intermetallic compound layer formed when Au wires are used. The intermetallic compound layer is mechanically stronger than metal configuring the electrode pads. Hence, as the intermetallic compound layer becomes thinner, mechanical strength of the electrode pads in the wire bonding portions decreases.

As described above, when all of the bonding wires are made of same metal without any exception as in the related art described above, it becomes difficult to improve temperature cycle resistance and reduce the material costs at the same time. Inventors of the present disclosure conducted an assiduous study and found that stress concentrates at corners of a semiconductor element during temperature cycles and cracking occurs noticeably in portions of electrode pads located close to the corners of the semiconductor element.

The inventors therefore paid attention to using different types of metal for bonding wires according to the location. Specifically, bonding wires to be connected to electrode pads located close to the corners and bonding wires to be connected to the electrode pads located remote from the corners are made of different types of metal. The present disclosure is achieved from the study made by the inventors as described above.

First Embodiment

Figure 1:
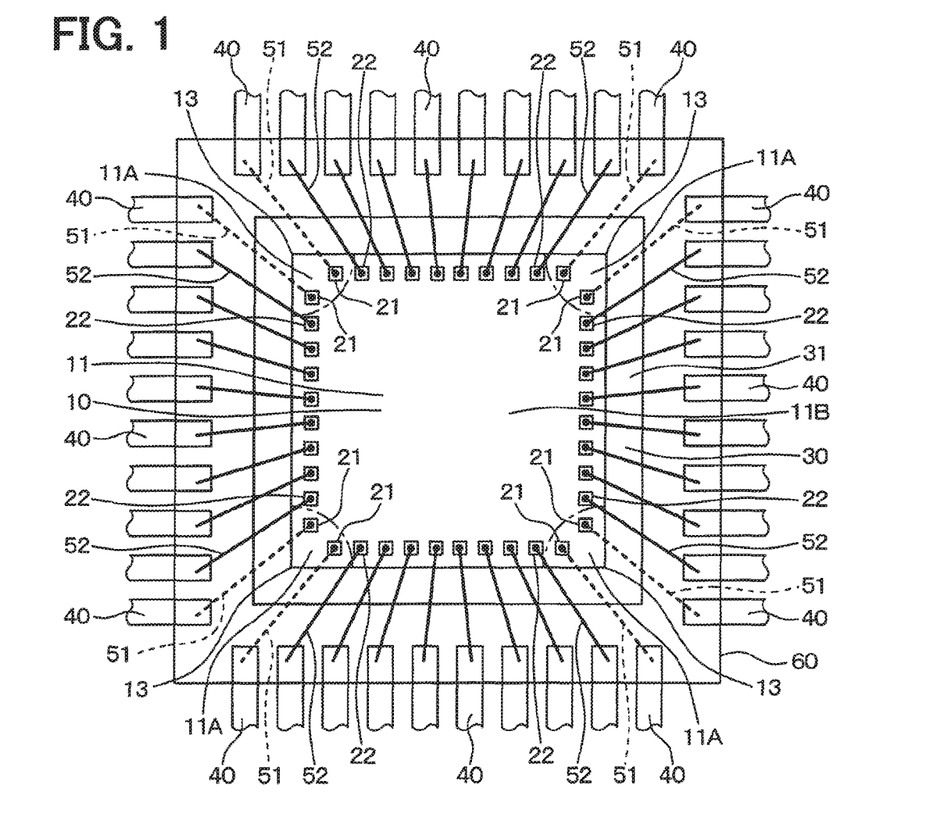
FIG. 1 is a schematic top view of a semiconductor device according to a first embodiment of the present disclosure.

A semiconductor device S1 according to a first embodiment of the present disclosure will be described with reference to FIG. 1 through FIG. 3. FIG. 1 shows a top view of outer shape of mold resin 60, and components located inside the mold resin 60 are shown in a transparent manner. The semiconductor device S1 can be employed as, for example, a device installed to a vehicle, such as an automobile, to drive various vehicular electronic devices.

The semiconductor device S1 of the present embodiment mainly includes a mold resin 60 in which a semiconductor element 10 disposed on an island 30 and lead terminals 40 are connected via bonding wires 51 and 52. The semiconductor element 10, the bonding wires 51, 52, and partial portions of the lead terminals 40 are sealed by the mold resin 60. The semiconductor device S1 has a QFP (Quad Flat Package) configuration.

The semiconductor element 10 has a rectangular plate shape, and has a first surface 11 and a second surface 12 opposite to each other as front and back surfaces. That is to say, the semiconductor element 10 has the first surface 11 and the second surface 12, which are disposed front and back plate sides, four side surfaces connected with the front and back surfaces, and four corners 13 of the rectangular plate.

The semiconductor element 10 is formed of a semiconductor, such as a Si (silicon) semiconductor. More specifically, the semiconductor element 10 includes IC chips, sensor chips, transistor elements, and so on. The semiconductor element 10 is manufactured by a conventional semiconductor process.

Multiple electrode pads 21 and 22 made of same metal are disposed on the first surface 11 of the semiconductor element 10. In the present embodiment, as is shown in FIG. 1, the electrode pads 21 and 22 are provided in a typical layout pattern.

That is to say, the multiple electrodes pads 21 and 22 are provided to the first surface 11 of the semiconductor element 10 in a portion closer to an outer edge in a layout pattern like a rectangular frame conforming to a shape of the outer edge. More specifically, the multiple electrode pads 21 and 22 are aligned on the first surface 11 of the semiconductor element 10 from respective portions in the vicinity of the four corners 13 along respective sides.

In the present embodiment, the multiple electrode pads 21 and 22 disposed on the first surface 11 of the semiconductor element 10 include first pads 21 located close to the corners 13 of the semiconductor element 10 and second pads 22 located apart from the corners 13 compared with the first pads 21.

More specifically, as is shown in FIG. 1, a continuous region including one corner 13 and a neighborhood of the corner 13 on the first surface 11 of the semiconductor element 10 is defined as a first region 11A. In FIG. 1, the first regions 11A are regions of the first surface 11 of the semiconductor element 10 disposed close to the respective corners 13 enclosed within alternate long and short dash lines. Remaining portion of the first surface 11 of the semiconductor element 10 other than the first regions 11A, that is, a region located more distant from the corners 13 than the first regions 11A is defined as a second region 11B.

In a case of FIG. 1, of the multiple electrode pads 21 and 22 disposed close to one of the corners 13, two electrode pads located closest to the corner 13 are defined as the first pads 21 and electrode pads other than the two first pads 21 are defined as the second pads 22.

The electrode pads 21 and 22 are made of a typical material for wire bonding pads of the semiconductor element 10. More specifically, the first pads 21 and the second pads 22 may be made of Al (aluminum) or Al alloy. Herein, Al alloy is an ally which includes Al as predominant metal. Herein, Al alloy is not limited to a particular alloy. Alloy including at least 90% Al content may be generally used as Al alloy. For example, Al alloy may include Al—Si and Al—Cu.

Although it is not shown in the drawing, a protection film, which is formed of an inorganic insulation film or an organic insulation film and is usually provided to a semiconductor such as Si, is disposed on the first surface 11 of the semiconductor element 10. The electrode pads 21 and 22 are exposed from the protection film. The electrode pads 21 and 22 are formed by sputtering, vapor deposition, or the like.

As has been described, the semiconductor element 10 has the multiple electrode pads 21 and 22 disposed on the first surface 11. Meanwhile, the semiconductor element 10 is attached to the island 30 on a side of the second surface 12 with an unillustrated die bonding material or the like.

Figure 2:
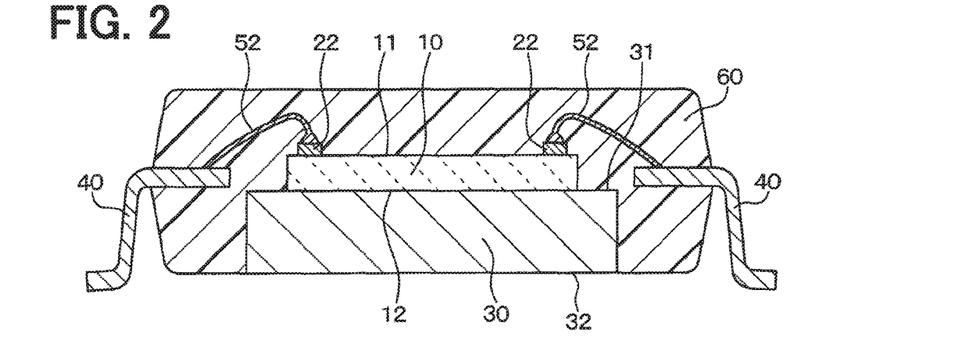
FIG. 2 is a schematic sectional view of the semiconductor device of FIG. 1.

As are shown in FIG. 1 and FIG. 2, the island 30 has a plate shape, and has a first surface 31 and a second surface 32 opposite to each other as front and back surfaces. Herein, the island 30 is shaped like a rectangular plate one size larger than the semiconductor element 10 when viewed from the top. The semiconductor element 10 is attached to the first surface 31 of the island 30, and is supported by the island 30.

The island 30 may be provided separately from a lead frame, which functions as a heat sink, or made of a lead frame material same with the lead terminals 40. In the case of the latter configuration, the island 30 and the lead terminals 40 are separated from each other by lead cutting generally performed after sealing the semiconductor element 10 using the mold resin 60.

The lead terminals 40 configure a connection member which is to be connected to the electrode pads 21 and 22 via the respective bonding wires 51 and 52. The lead terminals 40 are provided partially outside the semiconductor element 10. Herein, the multiple lead terminals 40 are provided along respective sides of the semiconductor element 10, and each lead terminal 40 is shaped like a typical elongate plate.

The multiple lead terminals 40 are located outside a framework of the island 30 radially so as to surround the island 30 like a typical QFP. The island 30 and the lead terminals 40 are made of excellent conductive metal, for example, Cu or 42 Alloy.

As are shown in FIGS. 1 and 2, the multiple electrode pads 21 and 22 disposed on the semiconductor element 10 are individually connected to the lead terminals 40 via the bonding wires 51 and 52 made of metal. In short, the bonding wires 51 and 52 are independently connected to the multiple electrode pads 21 and 22 in a one-to-one correspondence.

The multiple bonding wires 51 and 52 include first wires 51 and second wires 52 made of different materials. In FIG. 1, the first wires 51 are indicated by broken lines and the second wires 52 are indicated by solid lines for distinguishment. The first wires 51 are connected to the first pads 21 and the second wires 52 are connected to the second pads 22.

The first wires 51 are made of material having a smaller Young's modulus than a material of the second wires 52. For example, the first wires 51 are made of Au (gold) or Au alloy. Au alloy includes Au as predominant metal. The second wires 52 are made of Cu (copper) or Cu alloy. Cu alloy includes Cu as predominant metal.

Herein, Au alloy is not particularly limited to a specific alloy, but alloy including at least 90% of Au content may be generally used as Au alloy. A specific example of Au alloy is Au—Pd (palladium). Also, alloy including at least 90% of Cu content may be generally used as Cu alloy. A specific example of Cu alloy is Cu—Pd. As examples of a Young's modulus, a Young's modulus of Au forming the first wires 51 is about 80 GPa and a Young's modulus of Cu forming the second wires 52 is about 130 GPa.

Each bonding wire 51 and 52 is typically bonded in such a manner that one end of the wire disposed on a side of the electrode pad 21 or 22 of the semiconductor element 10 is bonded by ball bonding as a primary side, and the other end of the wire disposed on a side of the lead terminals 40 is bonded by wedge bonding as a secondary side.

The bonding configuration of the bonding wires 51 and 52 as above is typical and formed by a wire bonding method using a normal capillary. That is to say, ball bonding is applied to primary connection side using initial ball formed at wire tip end by electrical spark machining or the like, and subsequently wedge bonding is applied to the secondary side after routing the wire to the secondary connection portion.

Figure 3:
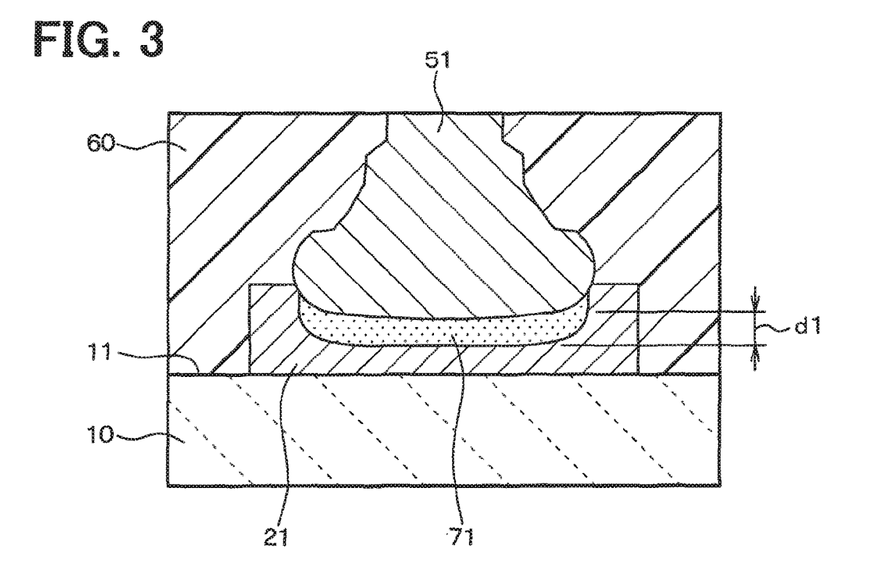
FIG. 3 is a schematic sectional view showing an intermetallic compound layer in a bonding portion between a first wire and a first pad of FIG. 1.
Figure 4:
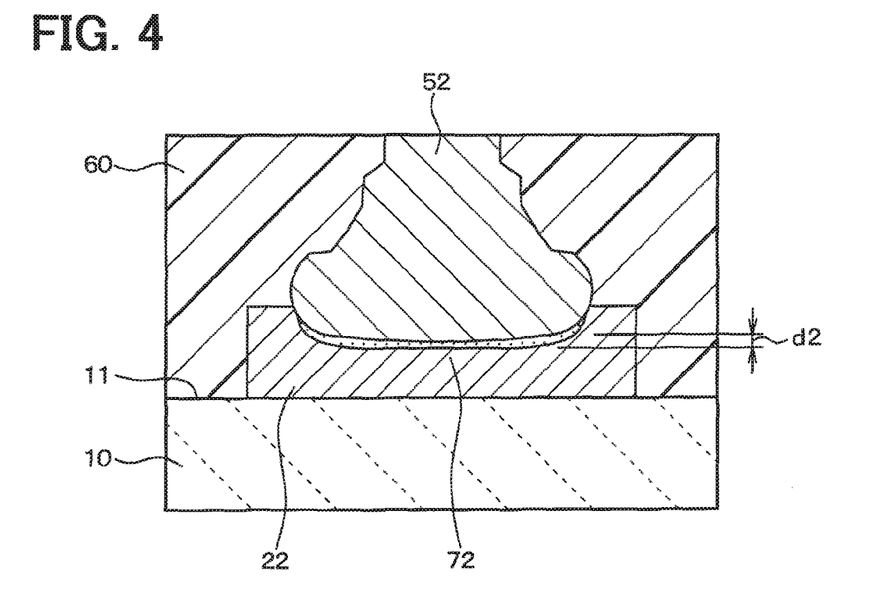
FIG. 4 is a schematic sectional view showing an intermetallic compound layer in a bonding portion between a second wire and a second pad of FIG. 1.

In the present embodiment, as are shown in FIG. 3 and FIG. 4, intermetallic compound layers 71 and 72 are provided between the electrode pads 21 and 22 and the bonding wires 51 and 52, respectively, for each of the multiple electrode pads 21 and 22.

The intermetallic compound layers 71 and 72 are made of an intermetallic compound (generally abbreviated to IMC) which is a compound including both of metal configuring the electrode pads 21 and 22 and metal configuring the bonding wires 51 and 52. The intermetallic compound layers 71 and 72 are formed by interdiffusion which takes place between atoms of metal configuring the bonding wires 51 and 52 and atoms of metal configuring the electrode pads 21 and 22 in wire bonding portions due to heat generated during wire bonding.

Herein, an intermetallic compound layer formed by the first wire 51 and the first pad 21 is referred to as the intermetallic compound layer 71 corresponding to the first pad (see FIG. 3), and an intermetallic compound layer formed by the second wire 52 and the second pad 22 is referred to as the intermetallic compound layer 72 corresponding to the second pad (see FIG. 4).

For example, an intermetallic compound forming the intermetallic compound layer 71 corresponding to the first pad is made of $Au_xAl_y$, which includes Au of the first wire 51 and Al of the first pad 21. Meanwhile, an intermetallic compound forming the intermetallic compound layer 72 corresponding to the second pad is made of $Cu_xAl_y$, which includes Cu of the second wire and Al of the second pad.

Herein, x and y in the compound $Au_xAl_y$, and in the compound $Cu_xAl_y$, are numbers indicating an atomic composition. Herein, $Au_xAl_y$ may be a mixture including various kinds of atomic composition and represented by but not limited to, for example, $AuAl_2$. Also, $Cu_xAl_y$ may be a mixture including various kinds of atomic composition and represented by but not limited to, for example, $CuAl_2$.

As are shown in FIG. 3 and FIG. 4, in the present embodiment, a thickness d1 of the intermetallic compound layer 71 corresponding to the first pad is larger than a thickness d2 of the intermetallic compound layer 72 corresponding to the second pad. A relation of thickness d1>d2, is established because Au which forms the first wire 51 has a larger diffusion coefficient into the electrode pad than Cu which forms the second wire 52.

As are shown in FIG. 3 and FIG. 4, each of the thicknesses d1 and d2 of the intermetallic compound layers 71 and 72, is a dimension of the intermetallic compound layer along a lamination direction of the bonding wire, the intermetallic compound layer, and the electrode pad. That is, the thickness d1, d2 is a layer thickness.

Normally, the thickness d1 of the intermetallic compound layer 71 corresponding to the first pad is one or more orders of magnitude larger than the thickness d2 of the intermetallic compound layer 72 corresponding to the second pad. For example, the thickness d1 of the intermetallic compound layer 71 corresponding to the first pad made of $Au_xAl_y$ is normally about 3 μm, and the thickness d2 of the intermetallic compound layer 72 corresponding to the second pad made of $Cu_xAl_y$ is normally about 0.1 μm.

As are shown in FIG. 1 and FIG. 2, in the semiconductor device S1, the mold resin 60 encloses and seals the semiconductor element 10, the island 30, the lead terminals 40, and the bonding wires 51 and 52. Like a typical QFP, a part of each lead terminal 40 protrudes from the mold resin 60 as an outer lead which is connectable to an outside device.

In the present embodiment, as is shown in FIG. 2, the second surface 32, which is a surface of the island 30 opposite to the surface on which the semiconductor element 10 is disposed, is exposed from the mold resin 60 for heat dissipation or the like.

That is to say, the semiconductor device S1 of the present embodiment is a package of so-called half-mold type. The mold resin 60 is made of a typical molding material, such as epoxy resin, and molded by a method, such as transfer molding or compression molding.

A manufacturing method of the semiconductor device S1 of the present embodiment is as follows. First, the semiconductor element 10 is disposed on and attached to the island 30. Then, the lead terminals 40 are provided outside the semiconductor element 10 and wire bonding is applied between the first pads 21 and the lead terminals 40 to connect the first pads 21 with the lead terminals 40 via the first wires 51. Similarly, the wire bonding is applied between the second pads 22 and the lead terminals 40 to connect the second pads 22 and the lead terminals 40 via the second wires 52.

Wire bonding order of the first wires 51 and the second wires 52 is not specified, and may be changed. After the wire bonding process ends, sealing process by the mold resin 60 is performed. Sealing process may be followed by lead cutting, lead molding, or the like as need arises. In the manner as above, the semiconductor device S1 of the present embodiment is manufactured.

In the present embodiment, the first wire 51 and the second wire 52 having different Young's moduli are used as the bonding wires, and the relatively soft first wire 51 is used for the first pad 21, which is disposed close to the corners 13 of the semiconductor element 10 and susceptible to cracking. Hence, it is easy to reduce stress applied from the first wire 51 to the first pad 21.

In addition, the thickness d1 of the intermetallic compound layer 71 corresponding to the first pad which is provided between the wire and the pad is set relatively thick for the first pad 21. It thus becomes easy to increase mechanical strength of the first pads 21 in the wire bonding portion. As a result, an occurrence of cracking in the first pad 21 due to temperature cycle can be readily restricted.

In addition, by changing materials of the bonding wires 51 and 52 for the first pad 21 and the second pad 22, respectively, it becomes no longer necessary to make all of the bonding wires 51 and 52 out of expensive and soft metal without any exception. It thus becomes easy to reduce a cost of wire materials. Thus, according to the present embodiment, a configuration capable of improving temperature cycle resistance of the electrode pads 21 and 22 and reducing material cost of the bonding wires 51 and 52 at the same time can be realized.

Second Embodiment

A semiconductor device according to a second embodiment of the present disclosure will be described chiefly on a difference from the first embodiment with reference to FIG. 5. In the present embodiment, except electrode pads 21 and 22 disposed for wire bonding, electrode pads for checking device properties, that is, checking pads 23 are provided to a first surface 11 of a semiconductor element 10.

Figure 5:
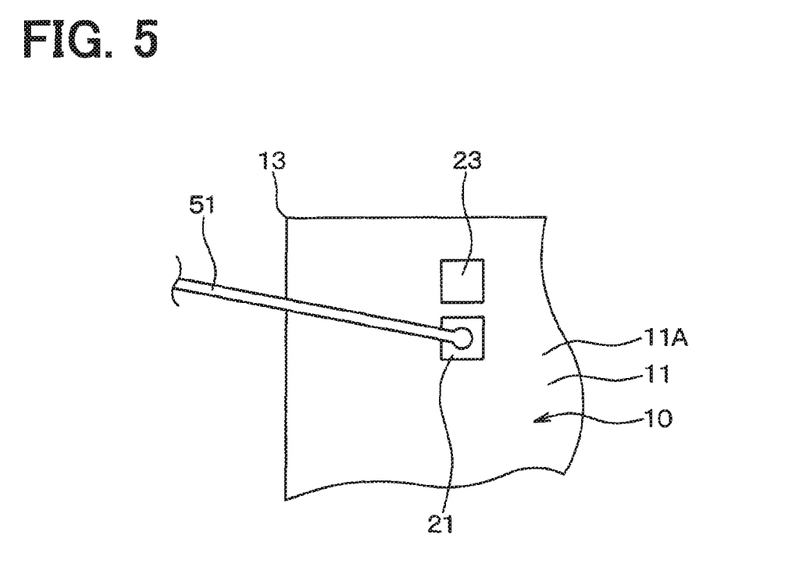
FIG. 5 is a schematic top view showing a part of a semiconductor device according to a second embodiment of the present disclosure.

As is shown in FIG. 5, in the present embodiment, each checking pad 23 is disposed closer to an outer edge than the first pad 21 on the first surface 11 of the semiconductor device 10. When provided in such a manner, even when cracking occurs in the checking pad 23, the device properties are not affected by the cracking occurred in the checking pad 23. Hence, there is no problem when the checking pad 23 is located closer to a corner 13 than the first pad 21.

Third Embodiment

A semiconductor device according to a third embodiment of the present disclosure will be described chiefly on a difference from the first embodiment with reference to FIG. 6 and FIG. 7. It is needless to say that the present embodiment can be also combined with the second embodiment above.

In the present embodiment, a semiconductor element 10 has a rectangular plate shape, and has a first surface 11 and a second surface 12 opposite to each other as front and back surfaces, and multiple electrode pads 21 and 22 made of same metal are disposed on the first surface 11. Similar to the lead terminals 40 of the first embodiment, in the present embodiment, lead terminals 40 are provided outside the semiconductor element 10 as the connection member.

The present embodiment is similar to the first embodiment above in that the multiple electrode pads 21 and 22 include first pads 21 located close to the corners 13 and second pads 22 located distant from the corners than the first pads 21.

The present embodiment is different from the first embodiment in that the first pads 21 and the second pads 22 are individually connected to the lead terminals 40 via second wires 52. That is to say, in the present embodiment, all of the multiple electrode pads 21 and 22 are connected to the lead terminals 40 via bonding wires made of same metal.

More specifically, in the present embodiment, the second pads 22 are connected to the lead terminals 40 via the second wires 52 described in the first embodiment. A connection configuration of the second pad 22, the second wire 52, and the lead terminal 40 in the present embodiment is same as the connection configuration shown in FIG. 1 and FIG. 2. More specifically, the second wires 52 are bonded to the second pads 22 by ball bonding and bonded to the lead terminals 40 by wedge bonding as in the first embodiment.

In the present embodiment, too, an intermetallic compound layer 72 corresponding to the second pad and having a thickness d2 is provided between the second pad 22 and the second wire 52 in a same manner as shown in FIG. 4 of the first embodiment above. The intermetallic compound layer 72 corresponding to the second pad is also referred to as a second intermetallic compound layer of the present disclosure.

Figure 6:
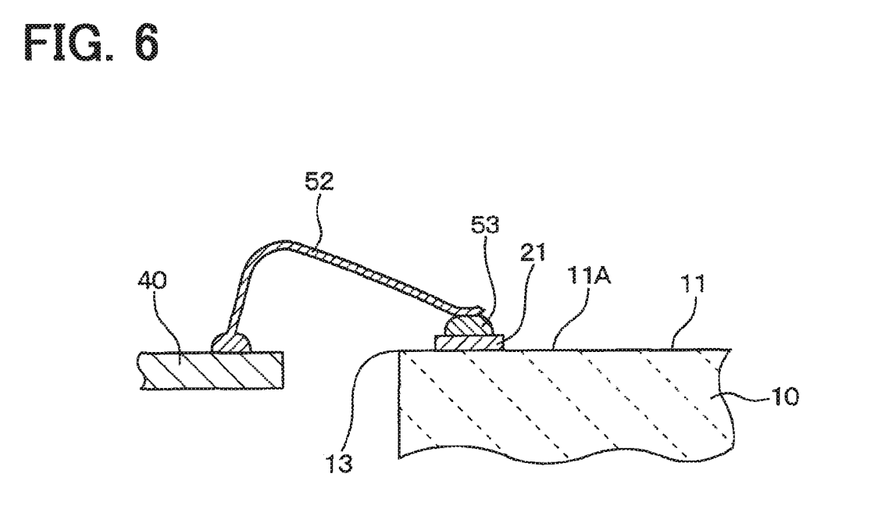
FIG. 6 is a schematic sectional view of a semiconductor device according to a third embodiment of the present disclosure.

As is shown in FIG. 6, the present embodiment is different from the first embodiment in that each first pad 21 located in a first region 11A close to the corresponding corner 13 is connected to the lead terminal 40 via the second wire 52. Further, a bump 53 made of metal having a smaller Young's modulus than the second wire 52 is bonded on each first pad 21.

More specifically, the bump 53 is made of metal, such as Au and Au alloy, similar to the first wires 51 of the first embodiment above. The bump 53 is formed by a normal ball bonding method, that is, by applying ball bonding for bonding wire using a wire bonding device, and cutting off the wire from the ball. It is apparent that the bump 53 is formed by the ball bonding method from a shape of the bump 53 in the semiconductor device.

Figure 7:
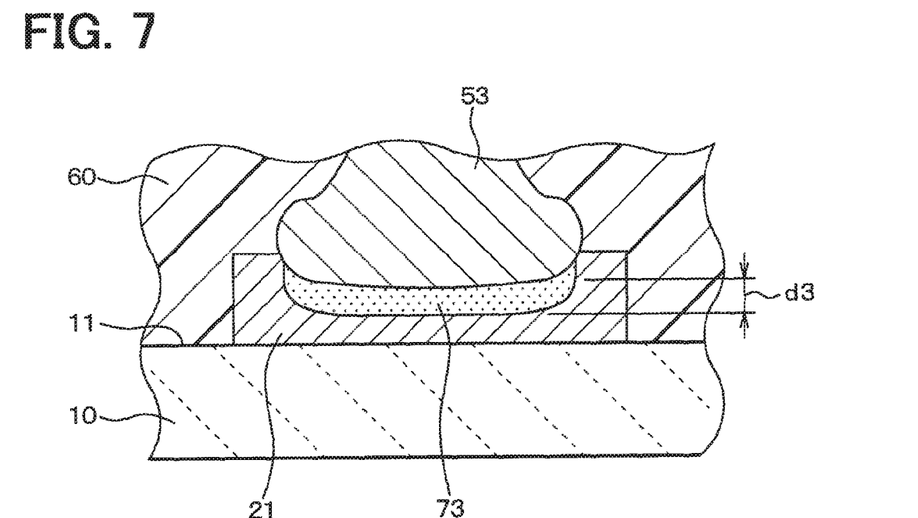
FIG. 7 is a schematic sectional view showing an intermetallic compound layer in a bonding portion between a bump and a first pad of FIG. 6.

As is shown in FIG. 7, a first intermetallic compound layer 73 made of an intermetallic compound including both of metal configuring the first pad 21 and metal configuring the bump 53 is provided between each first pad 21 and the bump 53. The first intermetallic compound layer 73 is made of a same material as, for example, the material of the intermetallic compound layer 71 corresponding to the first pad of the first embodiment above.

As is shown in FIG. 6, each second bonding wire 52 connecting the first pad 21 and the lead terminal 40 is bonded directly to the bump 53. Hence, the second wire 52 is bonded to the first pad 21 via the bump 53.

In the present embodiment, the second wire 52 connected to the first pad 21 is bonded to the lead terminal 40 by ball bonding as a primary side, and is bonded to the bump 53 disposed on the first pad 21 by wedge bonding as a secondary side.

The bonding order described above is adopted because in a case where bumps are formed on electrode pads and wire bonding is applied to the bumps, it is normally preferable to apply wedge bonding as secondary bonding to the bumps when ease of connection is taken into consideration.

In the present embodiment, a thickness d3 of the first intermetallic compound layer 73 shown in FIG. 7 is larger than the thickness d2 of the intermetallic compound layer 72 corresponding to the second pad. Specific material and thickness of the first intermetallic compound layer 73 can be same as material and thickness of the intermetallic compound layer 71 corresponding to the first pad of the first embodiment. Specific material and thickness of the intermetallic compound layer 72 corresponding to the second pad of the present embodiment can be same as material and thickness of the intermetallic compound layer 72 corresponding to the second pad in the first embodiment.

The semiconductor device of the present embodiment is manufactured by a method as follows. Firstly, the semiconductor element 10 is disposed on an island 30, and wire bonding is applied between each first pad 21 and the lead terminal 40 to connect each first pad 21 with the lead terminal 40 via the second wire 52. The wire bonding is also applied between each second pad 22 and the lead terminal 40 to connect each second pad 22 with the lead terminal 40.

Wire bonding applied to each second pad 22 is similar to the wire bonding applied in the first embodiment above. However, wire bonding applied to each first pad 21 is performed by forming the bump 53 on the first pad 21 first by ball bonding and then connecting the second wire 52 to the bump 53. In such a case, too, as in the first embodiment above, it does not matter whether wire bonding is applied first to the first wires 51 or the second wires 52.

When the wire bonding process is ended, sealing by the mold resin 60 is performed. If necessary, the sealing process may be followed by lead cutting, lead molding, or the like. The semiconductor device of the present embodiment is thus manufactured.

According to the present embodiment, the first pads 21 disposed close to the corners 13 of the semiconductor element 10 and susceptible to cracking are connected to the second wires 52 via the bumps 53 which are softer than the second wires 52. Hence, stress applied from the second wires 52 to the first pads 21 can be eased.

In addition, the first intermetallic compound layer 73 formed by the first pads 21 and the bumps 53 can be formed to a relatively large thickness. It thus becomes easy to increase mechanical strength of the first pads 21 in wire bonding portions. Thus, an occurrence of cracking in the first pads 21 due to temperature cycles can be restricted easily.

In the above configuration, since a need to use soft and expensive metal, such as Au, for the second wires 52 is eliminated, it becomes easy to reduce cost of wire materials. Consequently, according to the present embodiment, a configuration capable of improving temperature cycle resistance of the electrode pads 21 and 22 and reducing material cost of the bonding wires at the same time can be realized.

Other Embodiments

In the first embodiment above, each electrode pad 21 or 22 is bonded by applying ball bonding to one end of the bonding wire 51 or 52 on the side of the electrode pad 21 or 22 as the primary side. Further, each electrode pad 21 or 22 is bonded by applying wedge bonding to the other end of the bonding wire 51 or 52 on the side of the lead terminal 40 as the secondary side.

Alternatively, the bonding wire 51 or 52 is not necessarily bonded in order specified in the first embodiment. For example, one end of the first or second wire 51 or 52 on the side of the lead terminal 40 may be bonded first by ball bonding as the primary side, and subsequently the other end on the side of the electrode pad 21 or 22 may be bonded by wedge bonding as the secondary side.

In addition, the first wires 51 and the second wires 52 may be bonded to the electrode pads 21 and 22 and the lead terminals 40 in different orders. It should be noted that a growth rate of the intermetallic compound layers, that is, a thickness of the intermetallic compound layers to be formed is substantially same whether ball bonding or wedge bonding is applied.

In the first embodiment above, the first wires 51 are made of Au or Au alloy having a relatively small Young's modulus, and the second wires 52 are made of Cu or Cu alloy having a relatively large Young's modulus. However, a combination of materials is not limited to the above combination and other combinations of materials are also available as long as a Young's modulus of the first wires 51 is smaller than a Young's modulus of the second wires 52.

As another combination, for example, the first wires 51 may be made of Au or Au alloy and the second wires 52 may be made of Ag (silver) or Ag alloy in which predominant metal is Ag. Herein, a Young's modulus of Ag is about 100 GPa. Alloy with at least 90% Ag content is generally used as Ag alloy, and an example can be Ag—Pd.

As still another combination, the first wires 51 may be made of Ag or Ag alloy and the second wires 52 may be made of Cu or Cu alloy. It is needless to say that the thickness d1 of the intermetallic compound layer 71 corresponding to the first pad is larger than the thickness d2 of the intermetallic compound layer 72 corresponding to the second pad also in alternate combinations.

In the third embodiment above, the second wires 52 connected to the first pads 21 are bonded to the lead terminals 40 as the primary side by ball bonding, and bonded to the bumps 53 formed on the first pads 21 as the secondary side by wedge bonding. On the other hand, the second wires 52 connected to the second pads 22 are bonded to the second pads 22 by ball bonding and bonded to the lead terminals 40 by wedge bonding.

Alternatively, the second wires 52 are not necessarily bonded to the first pads 21 and the second pads 22 in order specified in the third embodiment above. For example, the second wires 52 connected to the first pads 21 may be bonded to the bumps 53 formed on the first pads 21 as the primary side by ball bonding, and subsequently bonded to the lead terminals 40 as the secondary side by wedge bonding.

Further, the second wires 52 are not necessarily bonded to the first pads 21 in order specified in the third embodiment above, either. The second wires 52 connected to the second pads may be bonded first to the lead terminals 40 as the primary side by ball bonding and subsequently bonded to the second pads 22 as the secondary side by wedge bonding.

In the third embodiment above, the bumps 53 are made of Au or Au alloy having a relatively small Young's modulus and the second wires 52 are made of Cu or Cu alloy having a relatively large Young's modulus. However, a combination of materials is not limited to the specified combination when a Young's modulus of the bumps 53 is smaller than a Young's modulus of the second wires 52.

As another combination, for example, the bumps 53 may be made of Au or Au alloy and the second wires 52 may be made of Ag or Ag alloy. Further, the bumps 53 may be made of Ag or Ag alloy and the second wires 52 may be made of Cu or Cu alloy. In other alternate combinations, too, the relation in the third embodiment above as to which one is larger than the other is secured between the thickness d3 of the first intermetallic compound layer 73 and the thickness d2 of the intermetallic compound layer 72 corresponding to the second pad.

In the first embodiment above, as is shown in FIG. 1, two first pads 21 are located in each first region 11A within the first surface 11 of the semiconductor element 10. However, the first regions 11A and the second region 11B are not necessarily divided in the manner as in the first embodiment above. Three or more first pads 21 may be located in each first region 11A by spreading the first regions 11A to an extent that presence of the second region 11B is secured.

Figure 8:
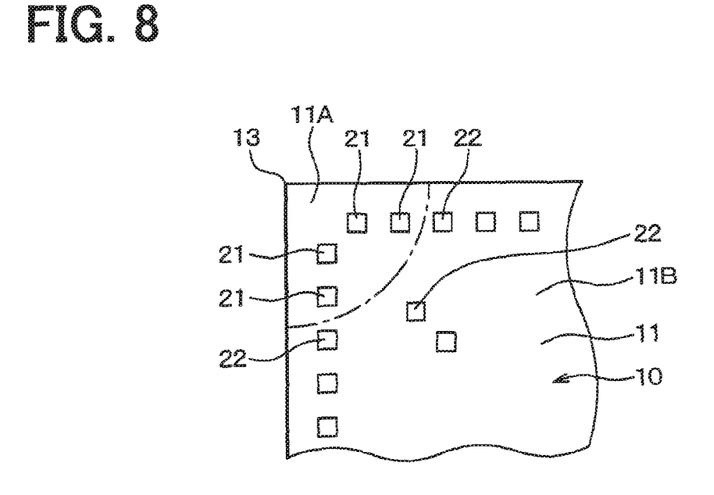
FIG. 8 is a schematic top view showing a part of a semiconductor device according to another embodiment of the present disclosure.

For example, according to another example shown in FIG. 8, by making the first region 11A larger than the first region 11A shown in FIG. 1, four first pads 21 are located in one first region 11A.

In the first embodiment above, the multiple electrode pads 21 and 22 are provided to the first surface 11 of the semiconductor element 10 in a portion closer to the outer edge in a layout pattern like a rectangular frame conforming to a shape of the outer edge. However, the layout pattern of the multiple electrode pads 21 and 22 is not limited to the pattern specified above as long as the first pads 21 located on the side of the corners 13 and the second pads 22 located more distant from the corners 13 than the first pads 21 can be distinguished from each other.

For example, as is shown in FIG. 8, a layout pattern may be such that the multiple electrode pads 21 and 22 are provided to the first surface 11 of the semiconductor element 10 from a neighborhood of the corner 13 over the second region 11B. In such a case, electrode pads located in the second region 11B close to a center are defined as the second pads 22.

In the respective embodiments above, the first pads 21 and the second pads 22 are made of Al or Al alloy. Alternatively, the electrode pads 21 and 22 may be made of other types of metal as long as thicknesses of the intermetallic compound layers satisfy the relation in the first or third embodiment above as to which one is larger than the other.

The connection member connected to the electrode pads 21 and 22 via the bonding wires 51 and 52 or bonding wires 52 alone is not limited to the lead terminals 40 described above. For example, other than the lead terminals 40, the connection member may be other semiconductor elements or wiring boards, a bus bar, or the like. In short, the connection member can be any member which can be bonded by wire bonding.

The semiconductor device is not limited to a package of half-mold type as shown in FIG. 2. For example, the semiconductor device may be a package of so-called full-mold type formed by also sealing the second surface 32 of the island 30 shown in FIG. 2 with the mold resin 60. Further, the semiconductor device may be formed without sealing the semiconductor element 10 and the bonding wires 51 and 52 by omitting the mold resin 60.

Referring to FIG. 1 and FIG. 2, the semiconductor element 10 may be disposed and supported on a member other than the island 30 described above. For example, the semiconductor element 10 may be disposed and supported on a wiring board or the like. Further, the semiconductor device may be configured by omitting a member supporting the semiconductor element 10 where appropriate. Further, the semiconductor device may include two or more semiconductor elements 10.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

The invention claimed is:

1. A semiconductor device comprising:
   a semiconductor element having a rectangular plate shape, the semiconductor element includes a first surface disposed on a front side and a second surface disposed on a back side;
   a plurality of electrode pads made of same metal and disposed on the first surface of the semiconductor element; and
   a connection member disposed outside of the semiconductor element,
   wherein
   the plurality of electrode pads are individually connected to the connection member via respective bonding wires made of metal,
   an intermetallic compound layer is disposed between each of the plurality of electrode pads and the corresponding bonding wire, and the intermetallic compound layer is made of an intermetallic compound including both of the metal configuring the plurality of electrode pads and the metal configuring the bonding wires,
   the plurality of electrode pads disposed on the first surface of the semiconductor element include a first pad and a second pad, the first pad is located close to a corner of the semiconductor element, and the second pad is located apart from the corner of the semiconductor element compared with the first pad,
   the bonding wires include a first wire connected to the first pad and a second wire connected to the second pad, and a Young's modulus of the first wire is smaller than a Young's modulus of the second wire, and
   a thickness of the intermetallic compound layer formed by the first wire and the first pad is larger than a thickness of the intermetallic compound layer formed by the second wire and the second pad.

2. The semiconductor device according to claim 1, wherein
   each of the first pad and the second pad is made of aluminum or aluminum alloy that includes aluminum as predominant metal.

3. The semiconductor device according to claim 1, wherein
   the first wire is made of gold or gold alloy that includes gold as predominant metal, and
   the second wire is made of copper or copper alloy that includes copper as predominant metal.

4. A semiconductor device comprising:
   a semiconductor element having a rectangular plate shape, the semiconductor element includes a first surface disposed on a front side and a second surface disposed on a back side;
   a plurality of electrode pads made of same metal and disposed on the first surface of the semiconductor element; and
   a connection member disposed outside of the semiconductor element,
   wherein
   the plurality of electrode pads are individually connected to the connection member via respective bonding wires made of same metal,
   the plurality of electrode pads disposed on the first surface of the semiconductor element include a first pad and a second pad, the first pad is located close to a corner of the semiconductor element, and the second pad is located apart from the corner of the semiconductor element compared with the first pad,
   a bump is bonded on the first pad, and the bump is made of metal having a smaller Young's modulus than the bonding wire corresponding to the first pad,
   a first intermetallic compound layer is disposed between the first pad and the bump, and the first intermetallic compound layer is made of an intermetallic compound including both of the metal configuring the first pad and the metal configuring the bump,
   the bonding wire connecting the first pad with the connection member is bonded on the first pad via the bump,
   a second intermetallic compound layer is disposed between the second pad and the bonding wire connected to the second pad, and the second intermetallic compound layer is made of an intermetallic compound including both of the metal configuring the second pad and the metal configuring the bonding wire, and
   a thickness of the first intermetallic compound layer is larger than a thickness of the second intermetallic compound layer.

5. The semiconductor device according to claim 1, wherein
   the thickness of the intermetallic compound layer formed by the first wire and the first pad is one or more orders of magnitude larger than the thickness of the intermetallic compound layer formed by the second wire and the second pad.

* * * * *